United States Patent [19]
Thakur et al.

[11] Patent Number: 5,686,748
[45] Date of Patent: Nov. 11, 1997

[54] DIELECTRIC MATERIAL AND PROCESS TO CREATE SAME

[75] Inventors: Randhir P.S. Thakur; Gurtej S. Sandhu, both of Boise, Id.

[73] Assignee: Micron Technology, Inc., Boise, Id.

[21] Appl. No.: 395,933

[22] Filed: Feb. 27, 1995

[51] Int. Cl.⁶ .......................... H01L 27/108; H01L 21/02
[52] U.S. Cl. .......................... 257/310; 257/315; 257/321; 257/410; 257/411; 257/764; 257/770; 257/649; 437/236; 437/237; 437/913; 437/919; 437/983
[58] Field of Search .......................... 257/315, 321, 257/649, 410, 411, 764, 770, 310; 437/15, 236, 237, 913, 919, 983

[56] References Cited

U.S. PATENT DOCUMENTS

| | | | |
|---|---|---|---|
| 4,690,730 | 9/1987 | Tang et al. | 257/649 |
| 4,949,162 | 8/1990 | Tamaki et al. | 257/649 |

Primary Examiner—Edward Wojciechowicz

[57] ABSTRACT

An embodiment of the present invention describes a method for forming a dielectric material for a storage capacitor during fabrication of a semiconductor memory device, by: cleaning impurities from the surface of a conductive plate of the storage capacitor; forming a nitride film over the conductive plate's cleaned surface; forming a metal silicide film over the nitride film; and oxidizing the metal silicide film by rapid thermal oxide (RTO) processing. A resulting structure is a capacitor having a dielectric material that is an oxidized metal silicide film.

15 Claims, 3 Drawing Sheets

DIELECTRIC MATERIAL AND PROCESS TO CREATE SAME

FIELD OF THE INVENTION

This invention relates to semiconductor fabrication and particularly to an dielectric material formed from a metal/silicon material and a process to create same.

BACKGROUND OF THE INVENTION

Dielectric materials used in semiconductors are selected depending on the intended use. For example, in the dynamic random access memory (DRAM) device, storage cells require a storage capacitor as a means of storing a charge to represent data. It is usually therefore desirable to select a dielectric material that possesses a high dielectric constant in order to prevent charge leakage. This is even more desirable as DRAM devices are more densely packed to contain more bit storage capability per die than early generations.

Many capacitor dielectrics have been utilized in attempts to shrink capacitor size and still maintain sufficient charge storage capability. Some examples include, thin film nitrides, oxide/nitride combinations or ferroelectric materials to name a few. However, each of these dielectric films possess limitations, thus forcing ongoing research to find the ideal capacitive dielectric film.

The present invention develops a very promising capacitive dielectric film from materials normally suited for forming conductive films as will come apparent to one skilled in the art from the following disclosure.

SUMMARY OF THE INVENTION

The invention is directed to a dielectric material comprising a material containing metal and silicon atoms (hereinafter metal/silicon material) that is transformed into a dielectric material by heating the metal/silicon material in a reactive gas ambient. One method for forming the dielectric material is by oxidizing a metal/silicon film by heating the metal silicide film in an oxygen ambient. A second method for forming the dielectric material is by nitridizing a metal/silicon film by heating the metal/silicon film in a nitrogen ambient. A third method for forming the dielectric material is by oxidizing a metal/silicon film by heating the metal silicide film in an halogen gas ambient.

DETAILED DESCRIPTION OF THE INVENTION

Figure 1:
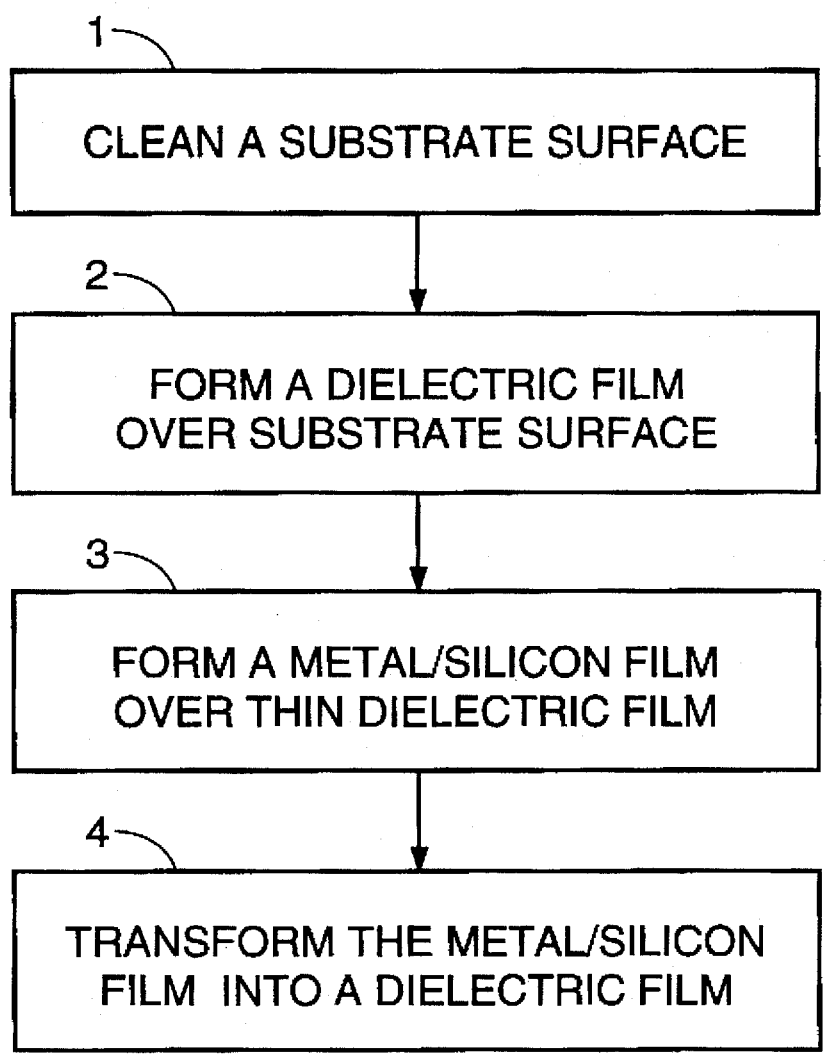
FIG. 1 show process steps to form the dielectric material of the present invention.

A preferred process to form the dielectric material of the present invention is show in FIG. 1 and specifically depicted in FIGS. 2–6, as will be appreciated by one skilled in the art from the following description of the invention.

Referring now to the process flow chart of FIG. 1, the surface of a substrate is cleaned in step 1 to remove any impurities that may be present thereon. In step 2, a dielectric film is formed over the substrate surface. In step 3, a metal/silicon film is formed over the dielectric film. The metal/silicon film can be a material that contains metal and silicon atoms. For example, the metal/silicon film can be a film having a mixture of metal and silicon atoms or the film can be a compound of bonding metal and silicon atoms, such as metal silicide. Finally, in step 4 the metal/silicon film is transformed into a dielectric material by heating the metal/silicon film in a reactive gas ambient. Though the first three steps are listed in the general embodiment, they are intended as suggested steps leading up to transforming the metal/silicon film into a dielectric material as taught in step 4. Therefore, one skilled in the art may form a metal/silicon material (typically a film) in any manner and then transform the metal/silicon film into a dielectric material as outlined in step 4.

In step 4, one method for forming the dielectric material is by oxidizing the metal/silicon film by heating the metal/silicon film in an oxygen ambient. A second method for forming the dielectric material is by nitridizing the metal/silicon film by heating the metal/silicon film in a nitrogen ambient. A third method for forming the dielectric material is by oxidizing the metal/silicon film by heating the metal silicide film in an halogen gas ambient.

Figure 2:
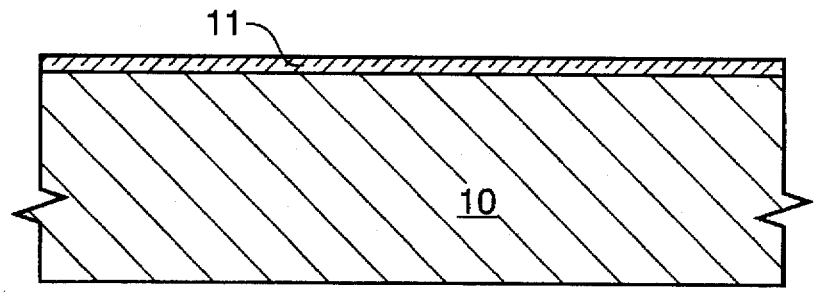
FIGS. 2–6 show the process steps of FIG. 1 being carried out on a substrate material.
Figure 3:
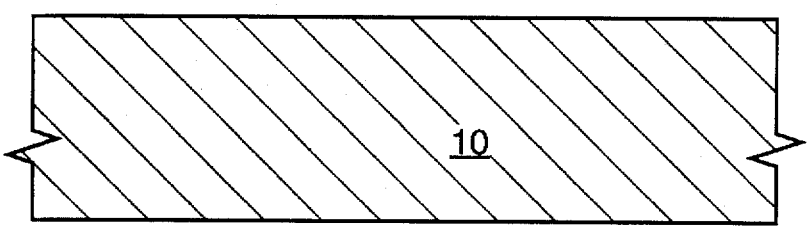

Applying the general concepts of the process flow chart of FIG. 1 to a more specific and preferred embodiment and now referring to FIG. 3, the surface of a silicon substrate 10 is pre-cleaned to remove impurities 11 which typically will be or include native oxide 4. Various cleaning method may be used including but not limited to, hydrofluoric vapor cleaning, ultravioletozone cleaning and rapid thermal processing (RTP). However, using RTP under the following conditions proved effective. RTP is performed at a temperature ranging from 600° C.–1200° C. (900° C.–1000° C. is preferred) and for a time period ranging from 5 sec–60 sec (20 sec–60 sec is preferred). FIG. 2 shows the resulting silicon substrate 10 with impurities removed. Substrate 10 is intended to represent any form of silicon, i.e., amorphous silicon, polycrystalline silicon, hemispherical gained, etc.

Figure 4:
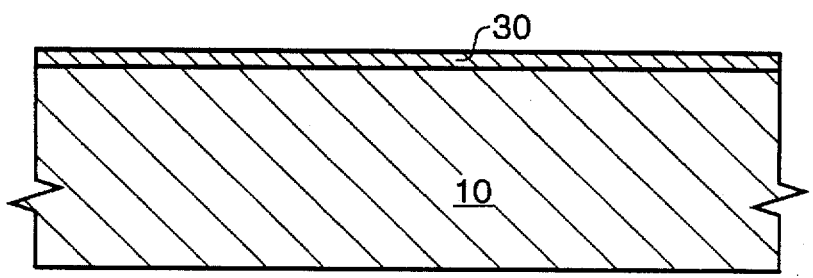

Now referring to FIG. 4, dielectric film 30 is formed over the cleaned surface of silicon substrate 10. The preferred dielectric film is a nitride film and though this nitride film may be formed using various methods, it is preferred to use rapid thermal nitridation (RTN) processing at a temperature ranging from 600° C.–1200° C. (approximately 600° C. is preferred) and for a time period ranging from 5 sec–60 sec (20 sec–60 sec is preferred).

Figure 5:
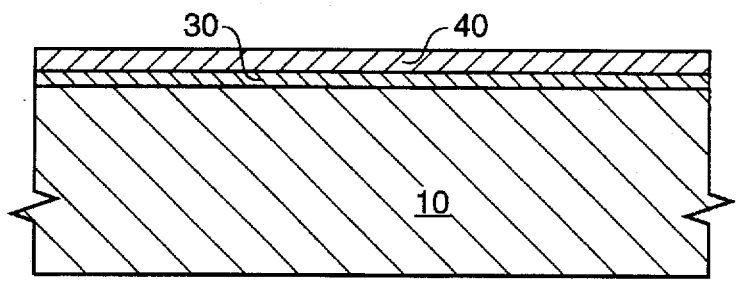

Now referring to FIG. 5, metal/silicon film 40 and in particular a metal silicide film is formed over dielectric film 30. The metal silicide film may be formed by various methods including but not limited to, chemical vapor deposition or sputtering. The preferred metal silicide film is any of the refractory metal silicide films and in particular (TiSi$_x$). A method of forming the silicide film and using TiSi$_x$ as an example, may be performed by, depositing a silicon layer, then depositing a titanium layer, and annealing the layers to cause the titanium layer to react with the silicon layer.

Figure 6:
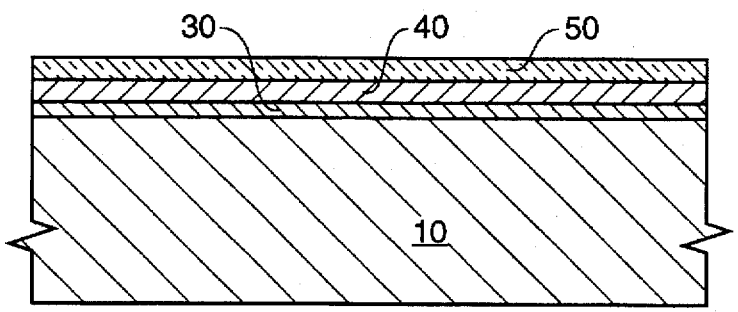

Referring now to FIG. 6, an oxide layer 50 is formed over silicide layer 40. This oxide layer is formed at a temperature ranging between 600° C.–1200° C. so that silicide layer 40 is sufficiently oxidized. It is preferred that a rapid thermal oxidation (RTO) process is used where the structure of FIG. 6 is placed in an oxygen ambient using an ambient gas selected from the group consisting of $O_2$, $O_3$, $N_2O$, NO and any combination of oxygen and nitrogen, or any combination of these gases, at a temperature ranging between 600° C.–1200° C. and for a time period ranging between 5 sec–60 sec (20 sec–60 sec is preferred). In the case where titanium silicide is used, a resultant TiO$_x$Si$_y$O$_z$ compound is formed that forms a high dielectric material that is suitable for use as a capacitor dielectric material as shown in FIG. 6.

Figure 7:
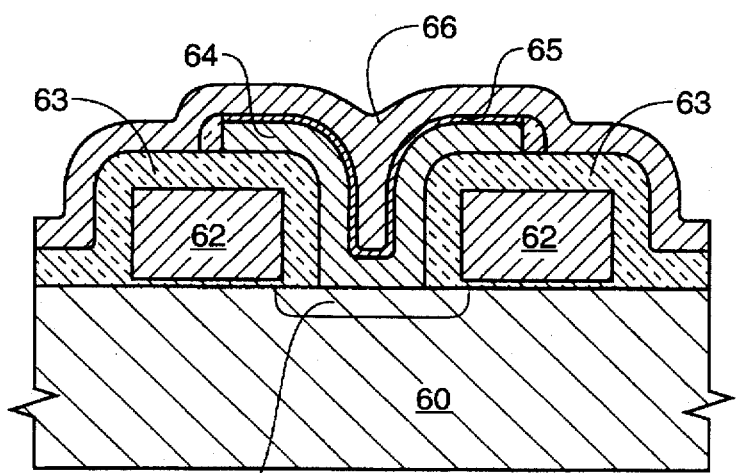
FIG. 7 shows a specific implementation of the dielectric material of the present invention.

Referring now to FIG. 7, a capacitor is shown sparming structures 62 (such as gates to an access device) comprising top electrode 66, a dielectric material 65 of the present invention, such as a $TiO_xSi_yO_z$ compound, and bottom electrode 64 making contact to an underlying diffusion region 61. The capacitive dielectric material of the present invention may be used in any capacitive type device and in particular in storage capacitors used in memory devices or in storage elements used in floating gate devices.

It is to be understood that although the present invention has been described with reference to a preferred embodiment, various modifications, known to those skilled in the art, may be made to the process steps presented herein without departing from the invention as recited in the several claims appended hereto. For example, all temperature ranges and time period ranges listed are not intended to be limited to the stated ranges but are instead intended to include all temperatures and times assumed therein, as well as all temperatures ranges and times period ranges assumed therein

What is claimed is:

1. A method for forming an oxidized compound over a silicon surface during fabrication of a semiconductor device, said method comprising the steps of:

cleaning the silicon surface to provide a clean silicon surface;

forming a dielectric film over said clean silicon surface;

forming a $TiSi_x$ film over said dielectric film; and oxidizing said $TiSi_x$ film by rapid thermal oxide (RTO) processing, thereby transforming said $TiSi_x$ film into said oxidized compound having the form $TiO_xSi_yO_z$.

2. The method of claim 1, wherein said cleaning the silicon surface comprises removing a native oxide from said silicon surface.

3. The method of claim 1, wherein said dielectric film comprises a nitride film.

4. The method of claim 1, wherein said cleaning of the surface of the silicon is accomplished by hydrofluoric vapor cleaning.

5. The method of claim 1, wherein said cleaning of the surface of the silicon is accomplished by ultraviolet-ozone cleaning.

6. The method of claim 1, wherein said cleaning of said silicon surface is accomplished by rapid thermal processing (RTP).

7. The method of claim 6, wherein the RTP is performed at a temperature ranging from 600° C.–1200° C.

8. The method of claim 6, wherein said RTP is performed for a time period ranging from 5 sec–60 sec.

9. The method of claim 1, wherein said step of forming a $TiSi_x$ film comprises chemical vapor deposition.

10. The method of claim 1, whereto said step of forming a $TiSi_x$ film comprises the steps of:

depositing a silicon layer;

depositing a titanium layer on said silicon layer; and annealing said layers to cause the titanium layer to react with the silicon layer.

11. The method of claim 3, wherein said step of forming a dielectric film comprises forming said nitride film by rapid thermal nitridation (RTN) processing.

12. The method of claim 11, wherein said RTN processing is performed at a temperature ranging from 600° C.–1200° C.

13. The method of claim 11, wherein said RTN processing is performed for a time period ranging from 5 sec–60 sec.

14. The method of claim 1, wherein said RTO processing is performed at a temperature ranging between 600° C.–1200° C.

15. The method of claim 14, wherein said RTO processing is performed for a time period ranging between 5 sec–60 sec.

* * * * *